United States Patent
Shakeshaft et al.

(10) Patent No.: US 7,424,064 B2
(45) Date of Patent: Sep. 9, 2008

(54) POLAR TRANSMITTER WITH DIGITAL TO RF CONVERTER

(75) Inventors: Niall Eric Shakeshaft, Helsinki (FI);
Jussi Heikki Vepsäläinen, Helsinki (FI);
Petri Tapani Eloranta, Espoo (FI);
Pauli Mikael Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 570 days.

(21) Appl. No.: 11/118,884

(22) Filed: Apr. 29, 2005

(65) Prior Publication Data

US 2005/0190854 A1     Sep. 1, 2005

Related U.S. Application Data

(63) Continuation-in-part of application No. 10/988,202, filed on Nov. 12, 2004, now Pat. No. 6,980,779, and a continuation-in-part of application No. 10/717,986, filed on Nov. 20, 2003, now Pat. No. 6,937,848.

(51) Int. Cl.
*H04L 27/00* (2006.01)
(52) U.S. Cl. .................. 375/295; 375/297; 455/118; 455/102; 341/155; 341/166
(58) Field of Classification Search ............ 375/302, 375/297, 269, 261, 296, 295; 455/118, 127.1, 455/102; 341/155, 166
See application file for complete search history.

(56) References Cited

U.S. PATENT DOCUMENTS

| 6,647,073 B2 * | 11/2003 | Tapio ................ 375/297 |
| 6,751,265 B1 * | 6/2004 | Schell et al. ............ 375/269 |
| 6,937,848 B2 * | 8/2005 | Eloranta et al. .......... 455/118 |

(Continued)

FOREIGN PATENT DOCUMENTS

WO    WO 02/37667    5/2002

OTHER PUBLICATIONS

IEEE 0-7803-7761-3/03; Proceedings of the 2003 International Symposium, vol. 3, Sec. 2-4; A. Hadjichristos; "Transmit Architectures and Power Control Schemes for Low Cost Highly Integrated Transceivers for GSM/EDGE Applications"; pp. III-610-III-613; May 2003.

(Continued)

*Primary Examiner*—Chieh M. Fan
*Assistant Examiner*—Sudhanshu C. Pathak
(74) *Attorney, Agent, or Firm*—Ware, Pressola, Van Der Sluys & Adolphson LLP

(57) ABSTRACT

A polar transmitter, operable in linear mode or switched mode, uses a conversion module to convert baseband signals into amplitude data and phase data. The phase data is used to phase modulate a carrier frequency in a radio frequency conversion module. The module comprises a plurality of parallel unit cells, each being a mixer cell type converter having a differential data switch section connected in series to a differential local oscillator-switch pair. The differential local oscillator-switch is connected in series to a current source. Each unit cell is adapted to receive a signal through an input end. In switched mode, the phase-modulated carrier frequency is amplitude modulated by the amplitude data through the supply voltage to a power amplifier. In linear mode, amplitude data is conveyed to the input end of the unit cells for modulating the phase-modulated carrier frequency in the conversion module.

13 Claims, 13 Drawing Sheets

U.S. PATENT DOCUMENTS

| | | | | |
|---|---|---|---|---|
| 6,980,779 | B2* | 12/2005 | Shakeshaft et al. | 455/127.1 |
| 7,126,999 | B2* | 10/2006 | Dent | 375/261 |
| 7,277,497 | B2* | 10/2007 | Hietala et al. | 375/302 |
| 7,280,612 | B2* | 10/2007 | Saed | 375/296 |
| 2003/0067994 | A1 | 4/2003 | Chadwick | 375/295 |
| 2004/0166813 | A1 | 8/2004 | Mann et al. | 455/69 |
| 2005/0191976 | A1* | 9/2005 | Shakeshaft et al. | 455/118 |

OTHER PUBLICATIONS

34th European Microwave Conference, Amsterdam; Jau et al.; "Polar Modulation-Based RF Power Amplifiers with Enhanced Envelope Processing Technique"; pp. 1317-1320; Oct. 2004.

IEEE Journal of Solid-State Circuits, vol. 39, No. 12; IEEE 0018-9200/04; Sowlati et al.; "Quad-Band GSM/GPRS/EDGE Polar Loop Transmitter"; pp. 2179-2189; Dec. 2004.

IEEE Journal of Solid-State Circuits 0018-9200/02, vol. 37, No. 9; Gutierrez-Aitken et al.; "Ultrahigh-Speed Direct Digital Synthesizer Using InP DHBT Technology"; pp. 1115-1119; Sep. 2002.

IEEE 2001 Custom Integrated Circuits Conference 0/7803/6591-7/01; Splett et al.; "Solutions for highly integrated future generation software radio basestation transceivers"; pp. 511-518; 2001.

IEEE 0-7803-3625-9/96; Koli et al.; "Current-Mode Up-Converting D/A-Interface for Mobile Communication Transmitter Applications"; pp. 20-24; 1996.

IEEE 0018-9200/03; Zhou et al.; "A 10-Bit Wide-Band CMOS Direct Digital RF Amplitude Modulator"; pp. 1182-1188; 2003.

* cited by examiner

POLAR TRANSMITTER WITH DIGITAL TO RF CONVERTER

This is a Continuation-In-Part application of and claiming priority to U.S. patent applications Ser. No. 10/717,986, filed Nov. 20, 2003 now U.S. Pat. No. 6,937,848; and Ser. No. 10/988,202, filed Nov. 12, 2004, now U.S. Pat. No. 6,980,779 assigned to the assignee of the instant application.

CROSS REFERENCE TO RELATED APPLICATIONS

The present invention is related to patent application Ser. No. 11/118,884, assigned to the assignee of the present invention, filed even date herewith.

FIELD OF THE INVENTION

The present invention relates generally to a polar RF transmitter and, more particularly, to a polar transmitter with a digital-to-RF converter.

BACKGROUND OF THE INVENTION

In radio communication applications the designs are continuously aiming for simpler and cheaper radio architectures to increase integration level of the mobile terminals. Conventionally, a direct upconversion transmitter has at least an I/Q modulator, an RF mixer, a filter and a power amplifier. The I/Q modulator is an efficient way to generate phase-modulated signals. It relies on two orthogonal signals, I (in-phase) and Q (quadrature), to produce a single complex waveform. In a direct upcon, version transmitter, the I/Q modulator transforms the frequency spectrum of each orthogonal input signal to the RF carrier frequency. As such, two digital-to-analog (D/A) converters are needed to transform a digital baseband into an analog baseband, as shown in FIG. 1a. In such a conventional direct upconversion transmitter, baseband digital data is resolved into in-phase and quadrature components. These data streams are then converted into analog, lowpass, baseband signals using separate digital-to-analog converters. The quantized, analog signals are then filtered by low-pass reconstruction filters in order to remove copies of the signals centered at harmonics of the baseband clock frequency. The filtered analog signals are used as inputs to the I/Q modulator. As shown in FIG. 1a, the I/Q modulator comprises two baseband-to-RF upconversion mixers with their output signals summed. The I/O modulator has two baseband inputs and two local oscillator inputs with 90° phase shift between the oscillator inputs (cos $\omega_l t$ and sin $\omega_l t$, with $\omega_l$ being the frequency of the local oscillator). The output of the I/Q modulator is an RF signal.

In order to make a complete transmitter, meeting the requirements of a real wireless standard, it may be necessary to include the following components:

a power amplifier (PA) to increase the output power to the required level;

a bandpass filter to suppress noise and/or spurious; and a power control module to achieve dynamic range capability, through one or more of the following means: 1) power amplifier gain adjustment; 2) variable-gain amplifier gain adjustment; and 3) I/Q modulator output power adjustment.

An example of such a direct upconversion transmitter is shown in FIG. 1b.

In recent years, other forms of transmitters have received attention from the RF R&D community: transmitters that use high efficiency, non-linear power amplifiers, including Class-C, D, E, F or saturated Class-B, in order to reduce transmitter power consumption. These non-linear power amplifiers, however, cannot pass amplitude modulation without spectral re-growth. Thus, the input RF signal can only have phase modulation. The amplitude modulation must be introduced separately in a PA power supply.

Due to the separation of amplitude and phase, these types of transmitter architecture are generically called Polar transmitters, as opposed to Cartesian transmitters which use I and Q baseband signals.

The polar transmitter architectures have the following general forms:

Envelope Elimination and Restoration (EER)

In this architecture, the RF signal is first produced with an I/Q modulator. The envelope is detected and fed forward to the PA power supply. The signal then goes through a limiter to keep a PM-only signal before being fed to the power amplifier. This architecture often includes an up-conversion as well, sometimes with an offset-loop approach.

Polar TX with Synthesizer Modulation

In this approach there is no envelope elimination and restoration, but rather the amplitude and phase signals are created in the digital baseband. The amplitude signal is fed to a DAC (digital to analog converter) and onto the non-linear power amplifier and power supply. The phase signal, which is differentiated to carry out frequency modulation, is used to modulate a phase-locked loop synthesizer. The synthesizer is often a fractional-N PLL with the FM data put into a sigma-delta modulator to obtain frequency modulation. In order to extend the bandwidth beyond the PLL loop bandwidth the following techniques can be used:

Predistortion or pre-emphasis to compensate for loop filter dynamics;

Addition of a second 'high pass' phase modulation path directly to the VCO control pin, in a two point modulation approach (see FIG. 2); and Use of phase feedback.

Fundamental problems associated with the direct upconversion transmitter using an I/Q modulator are:

High-power consumption in the I/Q Modulator block;

Non-ideal performance in the analog components within the I/Q modulator, such as non-linearity of the baseband amplifiers, carrier feed-through due to mismatch effects;

Bandwidth limited by analog baseband circuits; and

Large die area required for integrating all functions.

Current-steering D/A-converters may solve some the aforementioned problems associated with convention upconversion transmitter. A conventional current-steering D/A-converter comprises a plurality of parallel unit cells divided into two or more sub-blocks, as shown in FIG. 4. In the figure, the converter is presented in a typical segmented configuration, wherein the current in the LSB (least-significant bit) cells is generated with parallel binary weighted units whereas the MSB (most-significant bit) sub-block has a set of unary coded cells. The number of the unary coded cells is $(2^m-1)$, where m is the number of bits in the MSB sub-block. Thus, the current for the first bit in the MSB sub-block is generated in one unary coded cell, the current for the second bit in the MSB sub-block is generated in two unary coded cells, and the current for the m bit is generated in $2^{m-1}$ cells. The D/A converter has two current paths for conveying differential currents $I_{out}$ and $I_{xout}$ so that the analog signal output $V_{out}$ can be formed with two external load resistors (not shown).

Typically, each of the parallel unit cells comprises a differential switch pair connected in series to a cascode current source, as shown in FIG. 5. The differential switch pair has two current control paths Q1 and Q2, connected to the output terminals $V_o$ and $V_{xo}$ of the D/A converter. The currents in these paths are controlled by complementary signals $V_{LN+}$ and $V_{LN-}$, which are provided by a digital control logic and are indicative of the value of signal N. The cascode current source has two transistors Q3 and Q4 so as to allow the currents in the cell to be adjusted by DC bias4.

The D/A converters and I/Q modulators are complex and high performance analog elements. The requirement of these analog elements generally limits the flexibility of the RF transmitter.

Fully Digital Radio Transmitter

Ideally a digital radio transmitter is independent of the radio standard and can be used in all of the modulation schemes and signal frequencies. In practice, this requires a D/A converter that is capable of operating at least twice the maximum radio frequency of the used standard. One of the major problems associated with D/A converters for use in RF generation is the high sampling frequency. If an RF signal of 1.8 GHz is generated, the sampling rate in the digital baseband must be at least 3.6 GHz. Furthermore, in order to effectively filter the mirror image component around the frequency difference between the sampling frequency and the digital signal frequency, a much higher sampling rate is needed. A D/A converter with such a high sampling frequency is impractical to implement because of the high price and high power consumption. For that reason, D/A converters are typically used in the baseband or in the low IF range. These converters are used along with high performance analog mixers for RF generation. These I/Q mixers consume easily tens of milliamperes of DC currents. Moreover, even when the D/A converters are used in the baseband and in the IF range, the noise current spikes occur because of the high data rate of hundreds of megahertz. These noise spikes can limit the performance of the RF transmitter.

It is thus advantageous and desirable to provide a cost-effective method and device for carrying out digital-to-analog conversion associated with RF generation. At the same time, the power consumption is reduced.

Yuan (EP1338085) discloses a direct digital amplitude modulator wherein an upconverting type of converter cell is used. In Yuan, a number of sub-switched current source units are switched on or off according to the combinations of the digital input signal and the delayed or non-delayed clock signals to produce or to cancel quantized RF, IF or DC currents and/or voltages at the time precisely controlled by the delayed clock signals. As such, the performance of the circuit is low due to a slow settling of the current in the current source after switching the current source on.

It is advantageous and desirable to provide a method and device for direct digital amplitude modulation wherein the cutting off of the current flow is avoided.

SUMMARY OF THE INVENTION

A polar transmitter, according to the present invention, uses a cartesian-to-polar converter to convert I and Q baseband data into amplitude data and phase data. The phase data is used to phase modulate a carrier frequency in a carrier frequency generator and the phase-modulated carrier frequency is then conveyed to a RF conversion module. The RF conversion module combines the D/A conversion function and the upconversion function by a RF-carrier or IF-signal. The module comprises a plurality of parallel unit cells, each of which is a mixer cell type converter having a differential data switch section connected in series to a differential LO-switch pair. The differential LO-switch is further connected in series to a current source. Each unit cell is adapted to receive a signal through an input end. The phase-modulated carrier frequency is conveyed to the module through the differential LO-switches. The polar transmitter is operable in a linear mode or a switched mode. In the switched mode, the phase modulated carrier frequency is amplitude modulated by the amplitude data through the supply voltage of a power amplifier operatively connected to the output of the RF conversion module. In the linear mode, the amplitude data is conveyed to the input end of the unit cells in order to modulate the phase-modulated carrier frequency in the RF conversion module. The polar transmitter can be a dedicated linear mode transmitter, a dedicated switched mode transmitter, or a reconfigurable transmitter operable in linear mode or in switched mode.

Thus, the present invention provides a polar RF transmitter for transmitting RF signals based on a first digital baseband signal and a second digital baseband signal, the second baseband signal having a phase shift from the first baseband signal, the RF signals having a carrier frequency, wherein the first and second baseband signals are converted into baseband signals in a polar form having an amplitude data part and a phase data part.

The transmitter comprises:

a carrier frequency generator having a generator input for receiving a signal indicative of the phase data part, and a generator output for providing the carrier frequency modulated by the phase data part; and a RF conversion section for converting the carrier frequency modulated by the phase data part into phase-modulated signals so as to impose the amplitude data part on the phase-modulated signals for providing the RF signals, the digital-to-RF conversion section comprising:

a carrier input having two input ends to receive a carrier signal indicative of the carrier frequency modulated by the phase data part, a data input to receive a data signal indicative of the amplitude data part, the data signal having a plurality of data bits, and a conversion component adapted to convert the data signal for providing a differential output signal modulated by the carrier signal, the differential output signal indicative of the phase-modulated signals, formed with current loads and provided between two output ends, the conversion component comprising:

a plurality of conversion units connected in parallel, each unit adapted to receive a voltage indicative of a data signal value indicative of the data bits, the voltage provided between two voltage input ends, each unit comprising:

a first differential switch section having:
two input current paths, each operatively connected to a different one of the output ends; and
two differential switch pairs connected to the voltage input ends for conveying in the two input current paths differential currents indicative of the signal value;

a second differential switch section having two current paths, each operatively connected in series to a different one of the two differential switch pairs, the current paths operatively and separately connected to different ones of the carrier signal ends, for modulating the differential currents with the carrier signal; and a current source, operatively connected in series to the second differential switch section for controlling currents in the current paths.

According to the present invention, the polar transmitter further comprises:

a power amplifier for adjusting the RF signals prior to transmission, the power amplifier having a voltage supply input; and a power supply having an input end and an output end, the output end operatively connected to voltage supply input for providing a supply voltage to the power amplifier, wherein the amplitude data part is operatively connected to the input end of the power supply so as to cause said imposing of the amplitude data part on the phase-modulated signals through modulating the supply voltage to the power amplifier.

According to the present invention, the RF conversion section further comprises a variable gain amplifier to adjust signal level of the RF signals. Depending on the requirements of the specific wireless system, the polar transmitter may also further comprise a bandpass filter for frequency filtering the RF signals; and a channel selector for selecting the carrier frequency.

According to the present invention, the first and second baseband signals are converted into the baseband signals by a conversion means, and the amplitude data part is associated with a first path between the conversion means and the conversion component, and a second path between the conversion means and the conversion component through the carrier frequency generator. The polar transmitter further comprises a path adjuster for making the first and second paths substantially equal when the transmitter is operated in a linear mode.

According the present invention, the amplitude data part is associated with a first path between the conversion means and the power amplifier, and a second path between the conversion means and the power amplifier through the carrier frequency generator and the RF conversion section. The polar transmitter further comprises a path adjuster for making the first and second paths substantially equal when the transmitter is operated in a switched mode.

According to the present invention, the polar transmitter is reconfigurable to operate between a linear mode and a switched mode. The polar transmitter further comprises:

a digital-to-analog converter operatively connected to the power supply, and a switching means operatively connected between the power supply and the RF conversion section, said polar transmitter operable in a first mode and a second mode, such that when the transmitter is operated in the switched mode, the switching means is adapted to convey the amplitude data part to the input end of the power supply through the digital-to-analog converter so as to cause said imposing of the amplitude data part on the phase-modulated signals through modulating the supply voltage to the power amplifier, and when the transmitter is operated in the linear mode, the switching means is adapted to convey the amplitude data part to the RF conversion section so that the input signal converted by the conversion component is indicative of the amplitude data part. Alternatively, when the transmitter is operated in the linear mode, the switching means is adapted to convey the amplitude data part to the RF conversion section so that the control signal is indicative of the amplitude data part.

According to the present invention, the polar transmitter further comprises a frequency filter for filtering the data signal before the data signal is conveyed to the conversion component when the transmitter is operated in the first mode, and before the data signal is conveyed to the power supply when the transmitter is operated in the second mode; and a frequency filter for filtering the supply voltage to the power amplifier.

According to the present invention, the polar transmitter further comprises a power control module operatively connected to the input end of the power supply for adjusting the supply voltage to the power amplifier when the transmitter is operated in the linear mode, and operatively connected to the conversion module for adjusting signal level of the differential output signals when the transmitter is operated in the switched mode.

According to the present invention, the carrier frequency generator comprises a phase-lock loop synthesizer.

The present invention will become apparent upon reading the description taken in conjunction with FIGS. 5 to 11b.

DETAILED DESCRIPTION OF THE INVENTION

Figure 1A:
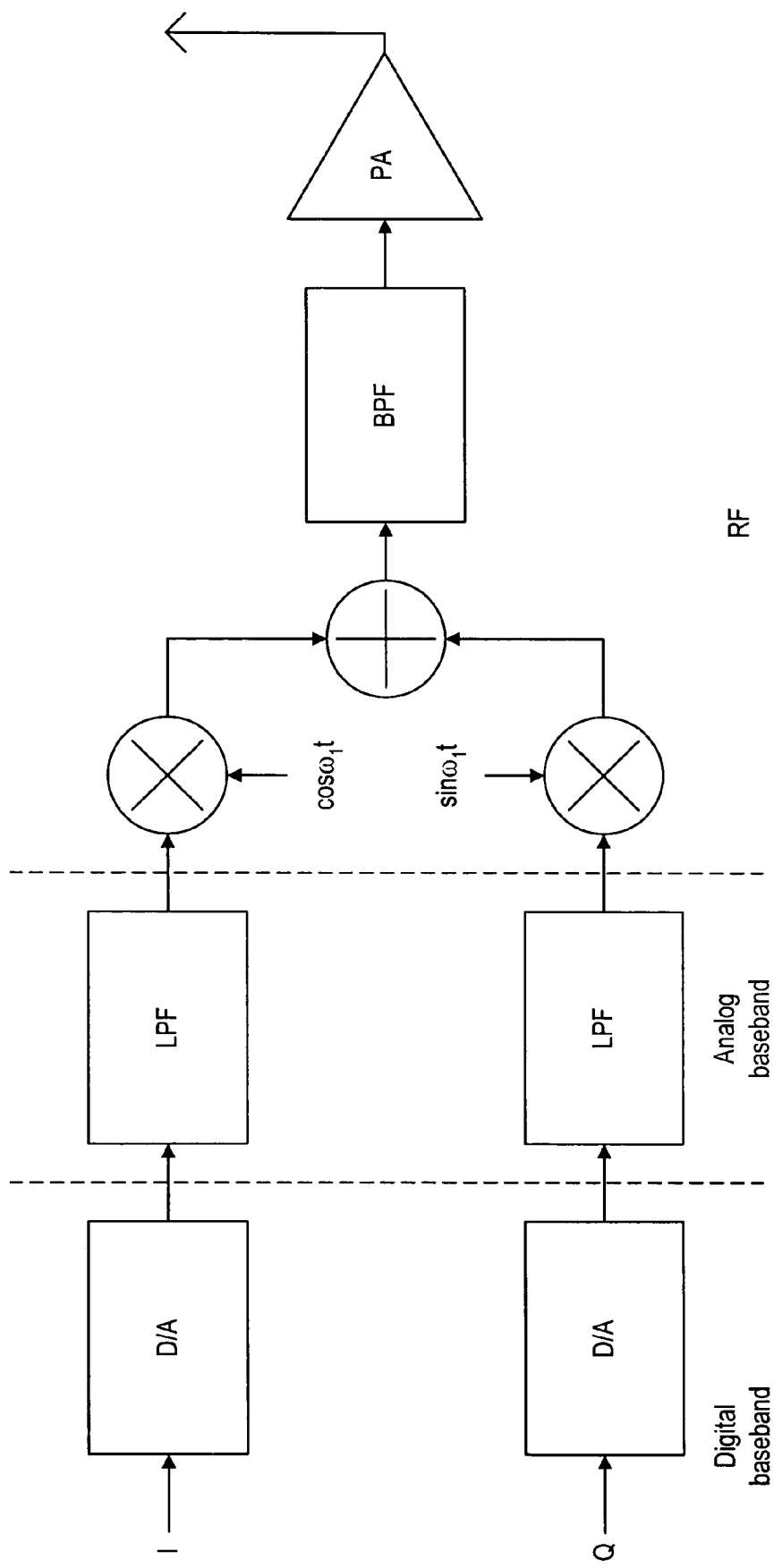
FIG. 1a is a block diagram showing a traditional direct upconversion transmitter.
Figure 1B:
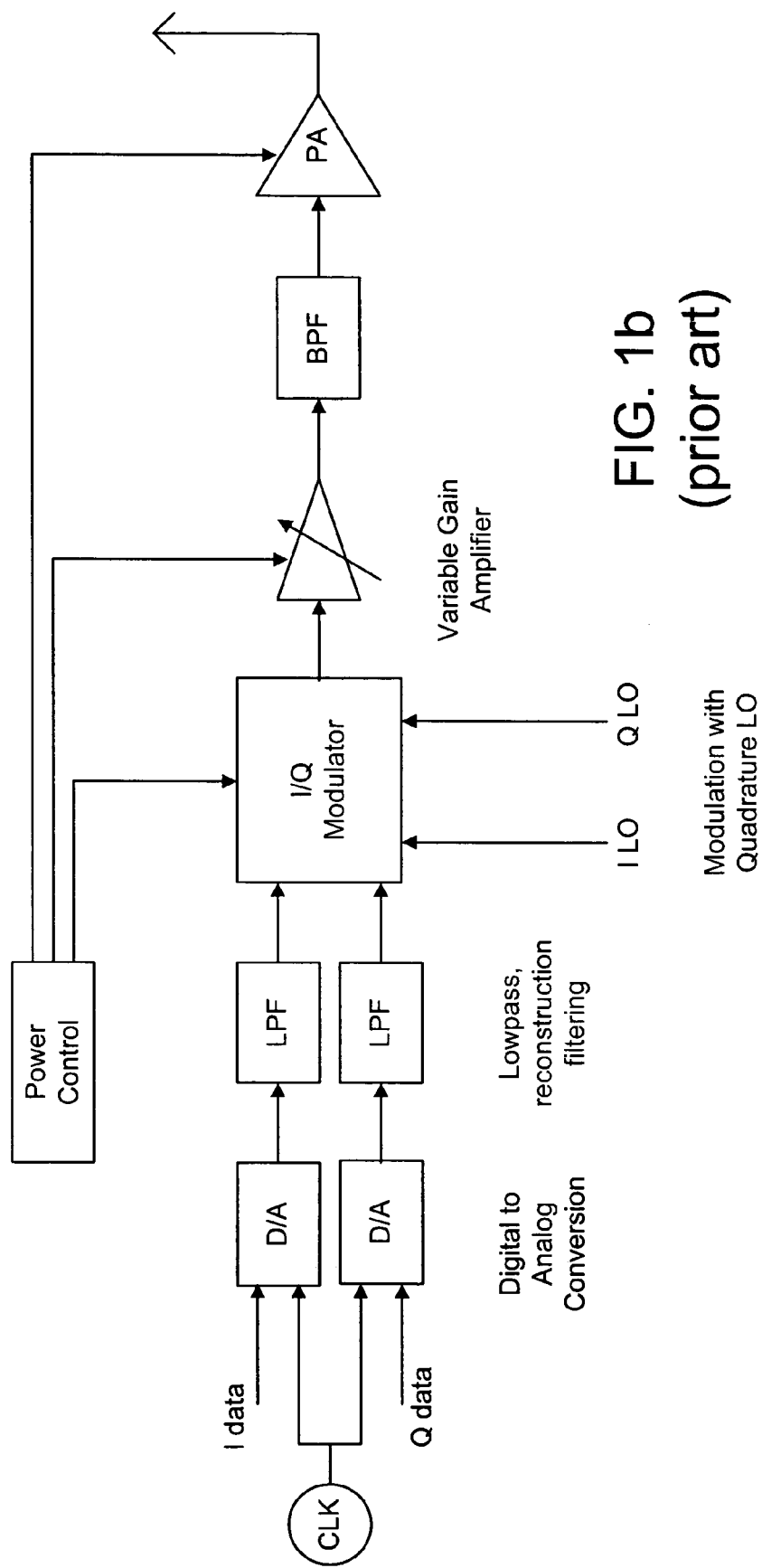
FIG. 1b is a block diagram showing a traditional direct upconversion transmitter with a variable gain amplifier and a power control module.
Figure 2:
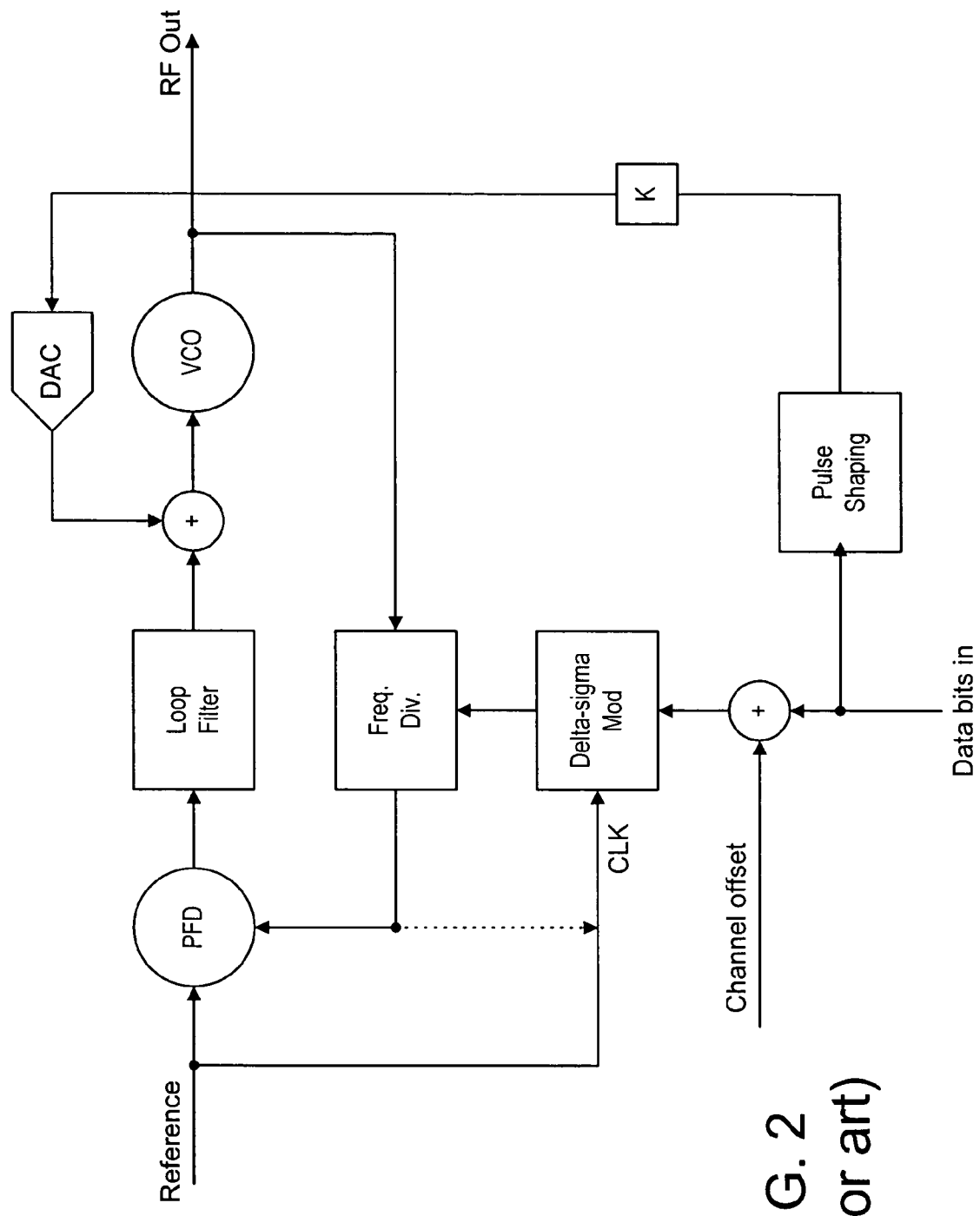
FIG. 2 is a block diagram showing a two-point synthesizer modulation module for use as a second high-pass phase modulation path in a prior art polar transmitter with synthesizer modulation.
Figure 3:
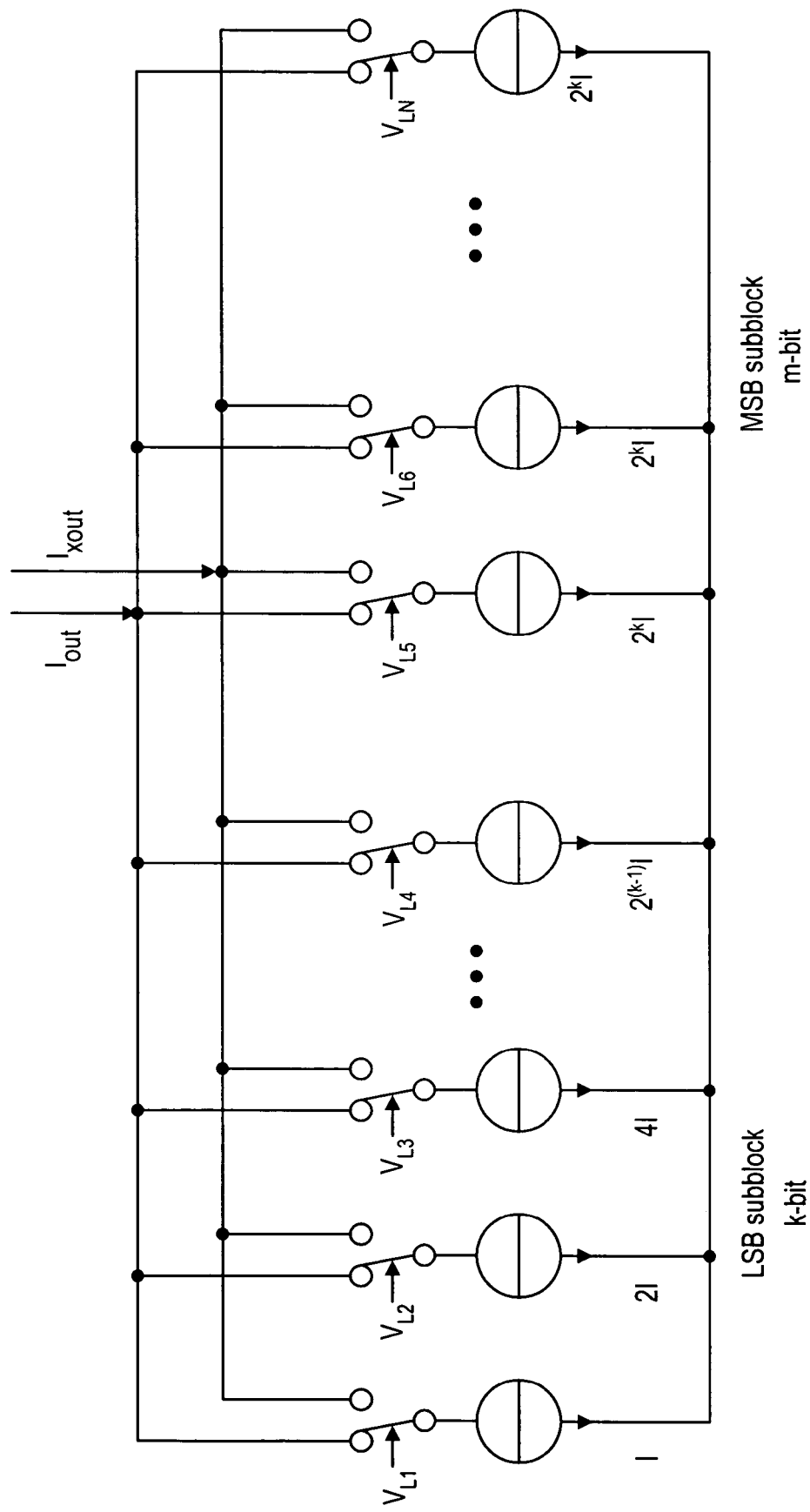
FIG. 3 is a schematic representation illustrating a prior art D/A converter.
Figure 5:
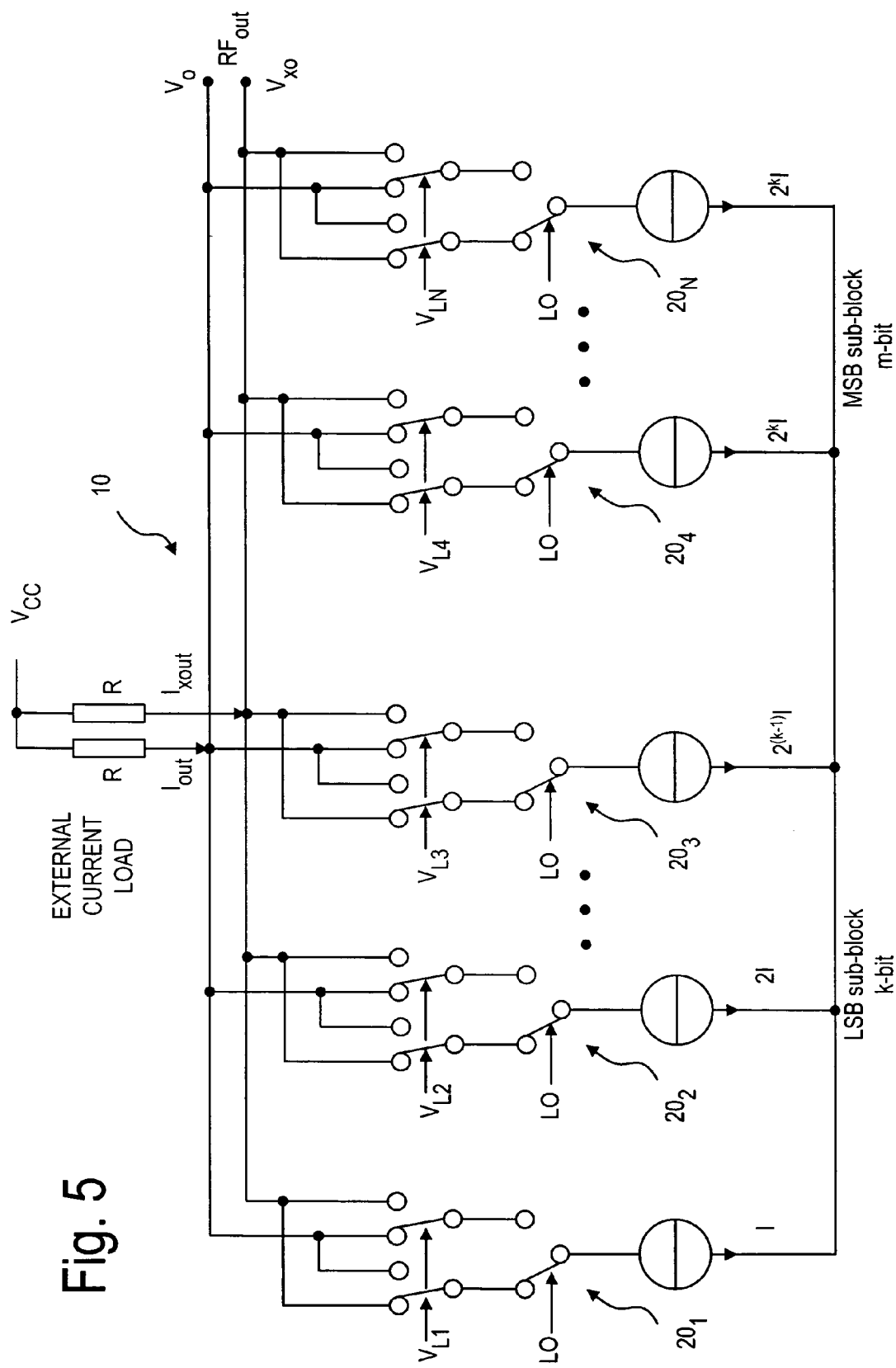
FIG. 5 is a schematic representation illustrating a Digital-to-RF-converter, according to the present invention.

The Digital-to-RF-converter, according to the present invention, combines the D/A conversion function and the upconversion function by a carrier (LO), which can be RF or IF. As shown in FIG. 5, the Digital-to-RF-converter 10 comprises a plurality of parallel unit cells $20_1$, $20_2$, ..., $20_N$, .... The upconverter 10 has a segmented configuration, including an LSB sub-block and an MSB sub-block. The current in the LSB sub-block is generated with parallel binary weighted units, whereas the current in the MSB sub-block is generated in a set of unary coded cells. The unary coding can be also used in the LSB sub-block. As with the convention D/A converter shown in FIG. 1, the number of the unary coded cells in the MSB sub-block in the Digital-to-RF-converter 10 is also $2^m - 1$, where m is the number of bits in MSB sub-block. The Digital-to-RF-converter 10 has two differential current paths for conveying differential currents $I_{out}$ and $I_{xout}$, so that the modulated output signal, $RF_{out}$, can be formed with two external load resistors, R. The modulated output signal is provided at two terminals $V_o$ and $V_{xo}$. The upconversion is carried out by applying a carrier signal (LO) from a local oscillator to each of the parallel unit cells 20.

Figure 6:
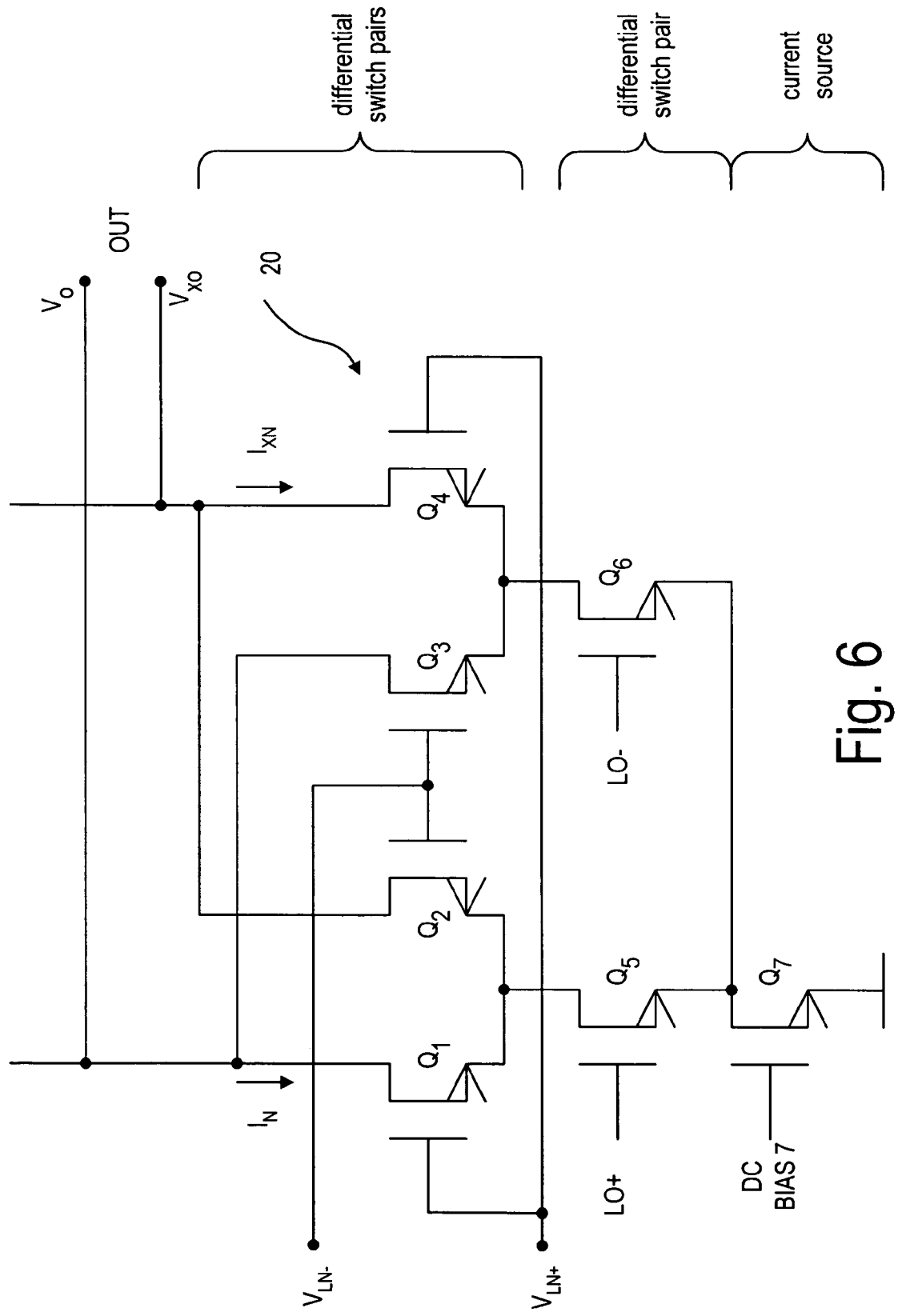
FIG. 6 is a circuitry showing a parallel unit cell in the Digital-to-RF-converter, according to the present invention.

Each of the parallel unit cells 20 is a Gilbert-cell type converter. It comprises a differential data switch section, connected in series with a differential LO-switch pair and a current source, as shown in FIG. 6. The differential data switch section has two differential switch pairs (Q1, Q2) and (Q3, Q4). Each differential data switch pair has two current control paths, $I_N$ and $I_{XN}$, connected to the output terminals $V_o$ and $V_{xo}$. The currents in these paths are controlled by complementary signals $V_{LN+}$ and $V_{LN-}$, which are provided by a digital control logic (not shown) and are indicative of the value of signal N. As shown in FIG. 6, the control voltage $V_{LN+}$ is used to control the currents in Q1 and Q4, and the control voltage $V_{LN-}$ is used to control the currents in Q2 and Q3. Accordingly, the current path Q1 is connected in parallel to the current path Q3. Likewise, the current path Q2 is connected in parallel to the current path Q4.

Figure 4:
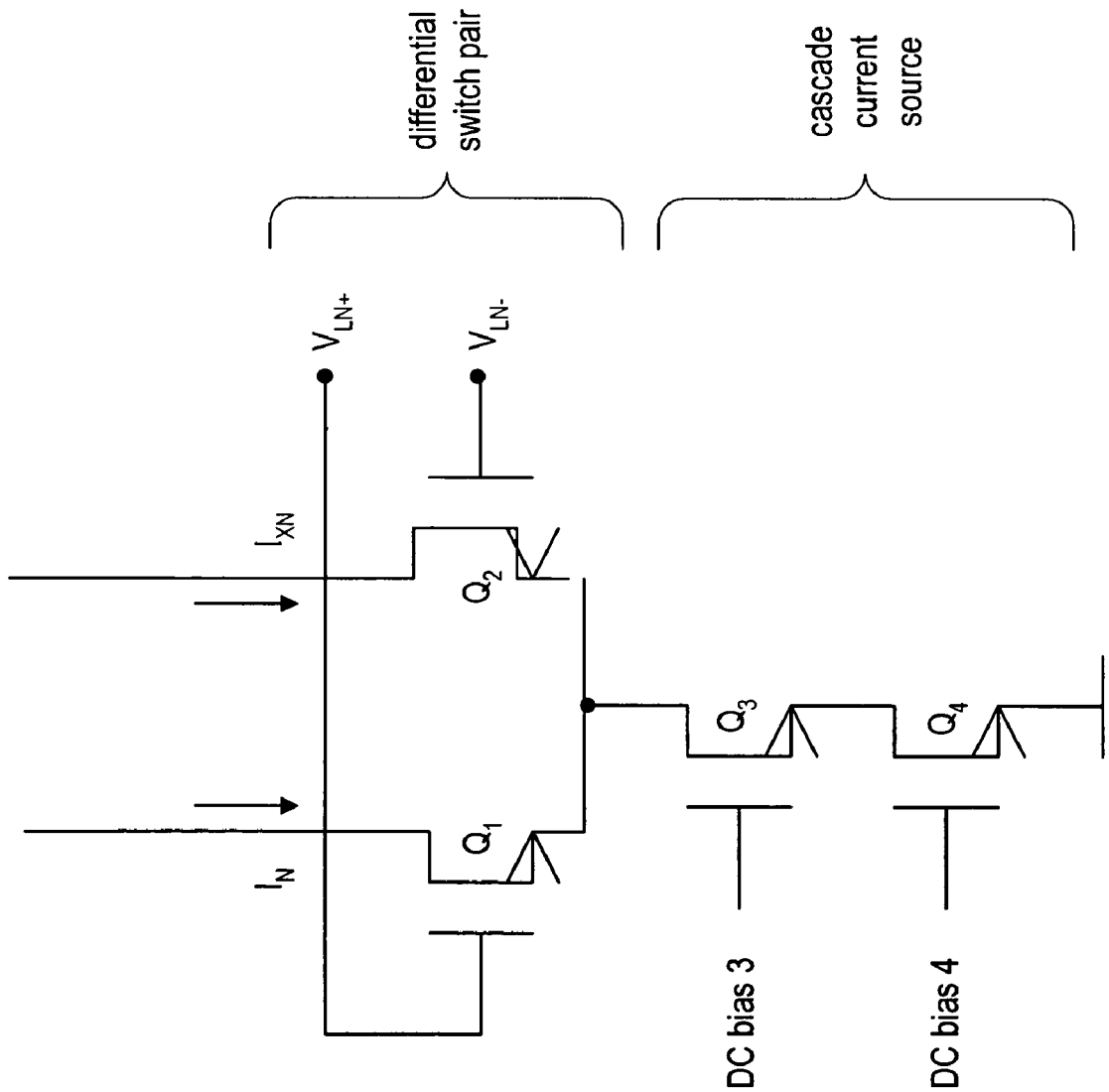
FIG. 4 is a circuitry showing a parallel unit cell in a prior art D/A converter.

Each of the differential data switch pairs is connected in series to a differential LO switches Q5 or Q6 so that the differential signals LO+ and LO− from the local oscillator (LO in FIG. 4) can be used to modulate the current in the differential data switch pairs. The differential LO switch formed with Q5 and Q6 is connected in series to the current source Q7, so as to allow the currents generated in the cell 20 to be adjusted by DC bias7.

It should be noted that Q1 to Q7 depicted in FIG. 6 are MOS transistors, but any one of them can be replaced with other type of transistors.

Figure 7:
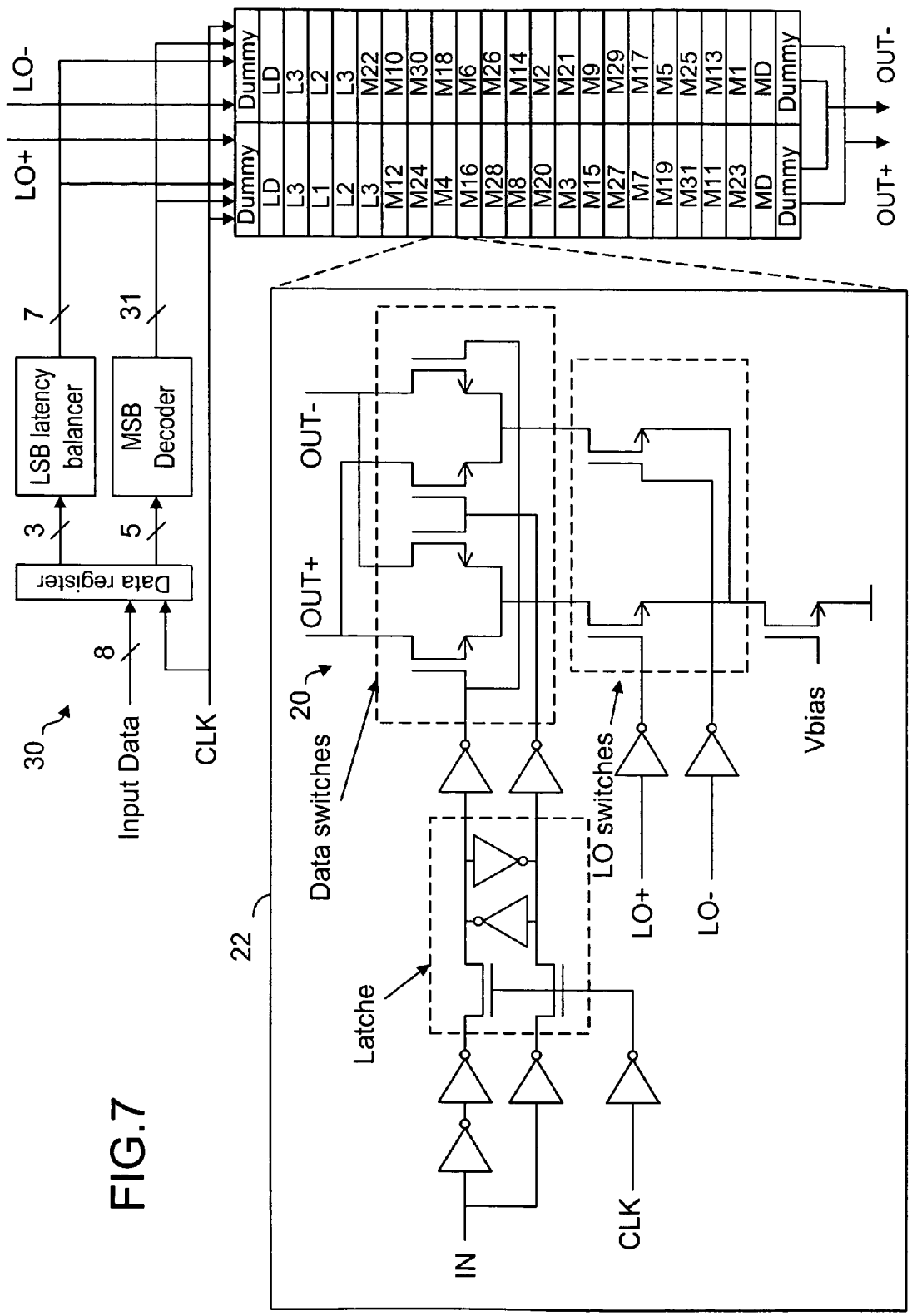
FIG. 7 is a circuitry showing a parallel unit cell in a converter architecture, according to the present invention.

In a converter architecture, according to the present invention, the switching elements in the cell 20 are also connected to an analog circuitry. As shown in FIG. 7, the data signal is synchronized with a local latch and buffered with rail-to-rail inverters that provide overlapping control signals for the data switches. The local LO-buffers have also a full supply voltage swing for forcing the LO switches to operate in their linear region. As such, high linearity of the signals can be obtained with accurate timing and symmetry of the control waveforms for both the data and the LO switches.

In the direct digital-to-RF converter (DRFC 30) as shown in FIG. 7, the 8-bit data signal is converted using 5+3 segmentation, where 5 MSB's are converted with 31 unit conversion cells and 3 LSB's are converted using 7 unit conversion cells. The LSB current is ⅛th of the MSB current. A thermometer decoder is used for converting the 5-bit binary signals for the MSB cells. The LSB cells are controlled without decoding. In the LSB's, a necessary number of cells are connected in parallel to form the binary weighting. The accurate LO distribution to all of the 38 unit cells is crucial in achieving the high dynamic performance. Tree-like distribution networks driven with large LO-buffers are used with well-balanced loads in all of the branches. The switching order to the MSB cells is optimized to compensate the mismatch in the LO synchronization.

Figure 8:
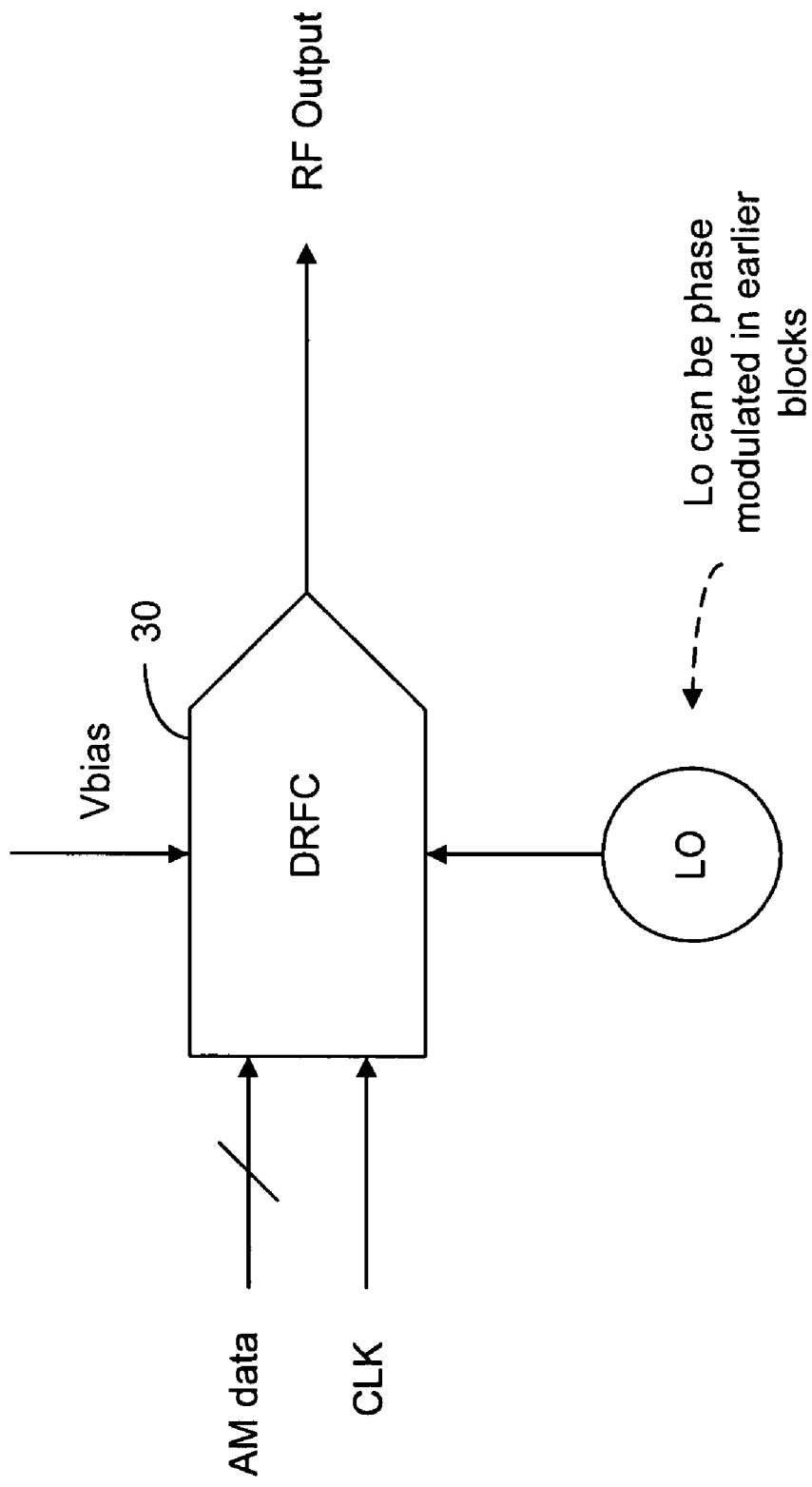
FIG. 8 is a block diagram showing amplitude data part in the baseband input data being used as the input data to the converter architecture.

According to the present invention, the DRFC 30 is used as a digital amplitude modulator in a polar transmitter, as shown in FIG. 8. The DRFC 30 is used as a "digital mixer" mainly to impose the AM data onto a carrier signal in a transmitter where phase modulation is not required or where only amplitude modulation is required. For AM-only transmission, the LO can be unmodulated. Alternatively, in applications where the carrier is phase modulated, the combination of a phase modulated carrier and amplitude modulation in the DRFC 30 forms a polar transmitter, as shown in FIG. 9.

Figure 9:
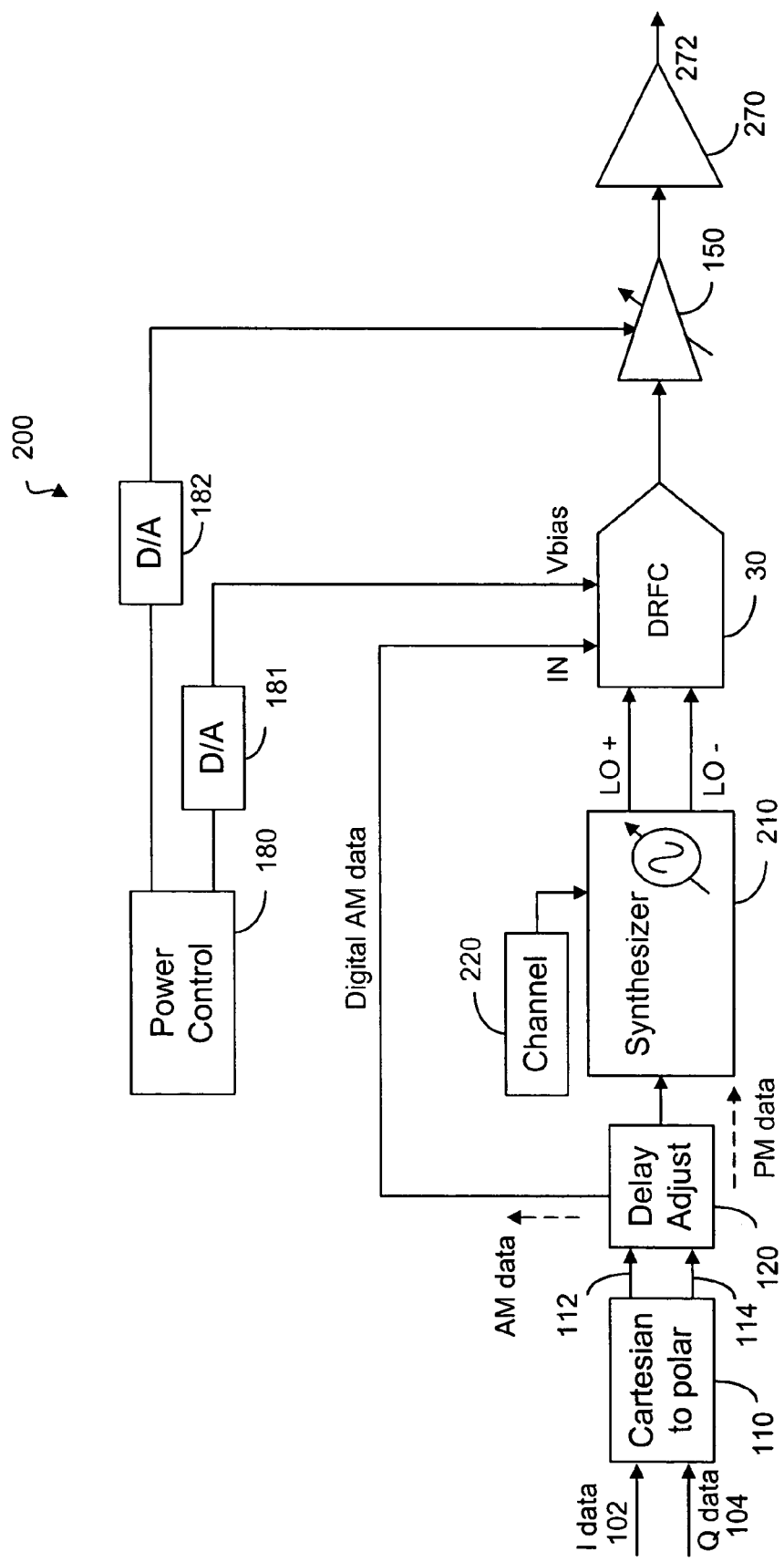
FIG. 9 is a block diagram showing a polar transmitter operated in a linear mode, using the converter architecture of the present invention.

In the polar transmitter 200 as shown in FIG. 9, I data 102 and Q data 104 are converted by a Cartesian-to-Polar converter 110 into an amplitude (AM) data part 112 and a phase (PM) data part 114. Because the AM data part and the PM data part go through different paths before they meet again at the DRFC 30, their paths may be different. Thus, a delay adjustment block 120 is used to adjust the paths so that the paths are substantially equal. The PM data is used to modulate a phase-locked loop synthesizer 210. For example, the synthesizer 210 is a fractional-N PLL with pre-emphasis to compensate for loop filter dynamics, or with two-point modulation. A channel selector 220 is used to select the carrier frequency. The phase-modulated carrier signal 212 from the output of the synthesizer 210 is then fed to a DRFC 30 for amplitude modulation by the AM data part. Thus, the output 232 of the DRFC 30 is a phase and amplitude modulated RF signal.

In order to make a complete transmitter, it may be necessary that the transmitter 200 further comprises a variable gain amplifier 150 and a linear power amplifier 270. In order to meet the requirement of a wireless standard, a power control module 180 is operatively connected to the DRFC 30 and the variable gain amplifier 150 so as to achieve desirable dynamic range capability and a desirable output level of the RF signal at output 272. The RF signal at output 272 is substantially an amplified version of the phase and amplitude modulated RF signal at output 232. The power amplifier 270 is operating as Class A or Class AB. If the output of power control module 180 is digital, digital-to-analog converters (DACs) 181, 182 are used to convert the digital output to an analog signal. However, DACs 181, 182 can be implemented within the power control module 180.

Figure 10:
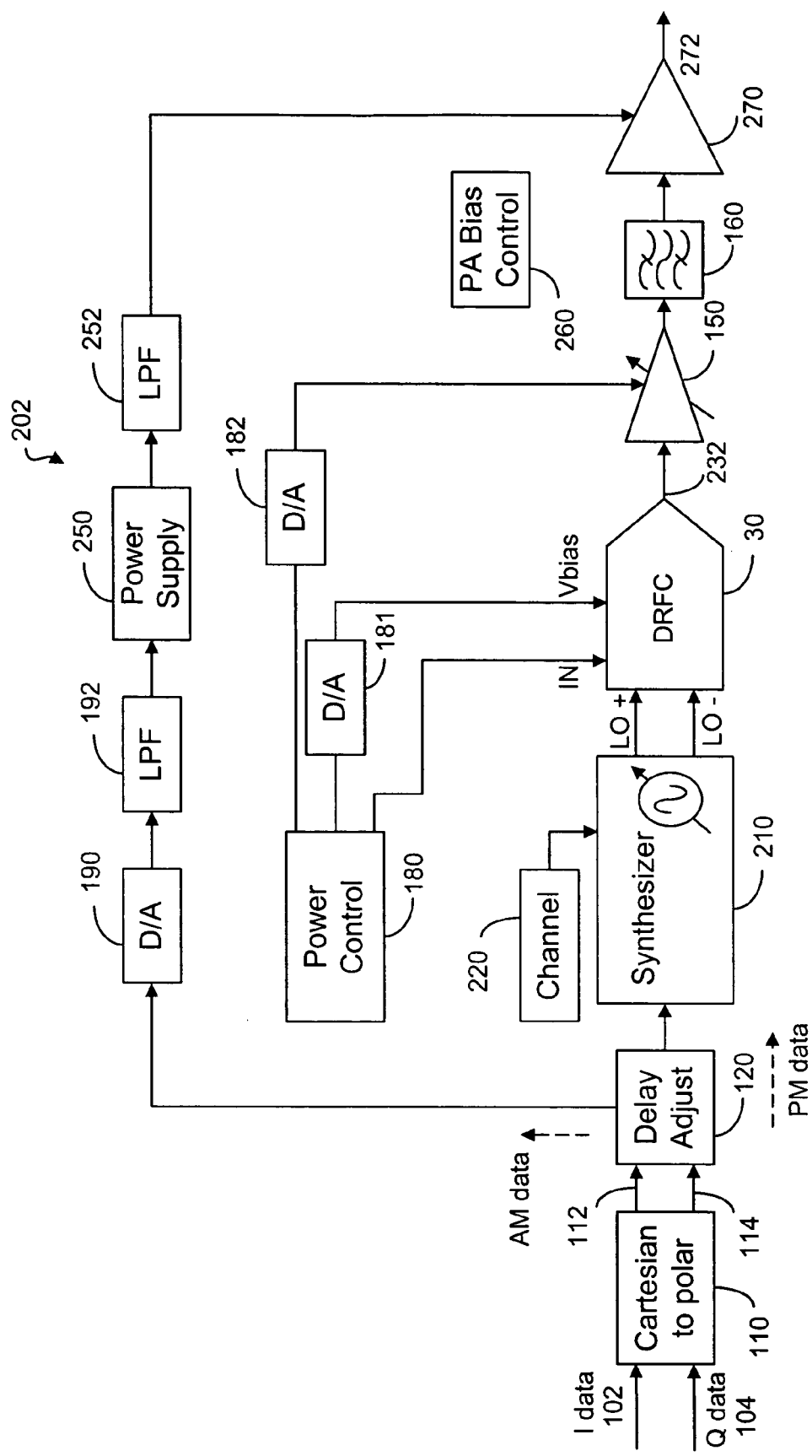
FIG. 10 is a block diagram showing a polar transmitter operated in a switched mode, using the converter architecture of the present invention.

The embodiment as shown in FIG. 9 can be referred to as a polar transmitter with digital amplitude modulation operated in a linear mode. In another embodiment of the present invention, the polar transmitter with digital amplitude modulation is operated in a switched mode. In the polar transmitter 202 as shown in FIG. 10, the output 232 of the DRFC 30 is a phase-only modulated RF signal, and the input to the power amplifier 270 has a constant envelope. The digital AM data part, after being converted to an analog signal by an DAC 190, is fed forward in order to be imposed on the phase-only modulated RF signal through modulating the power supply (provided by a power supply 250) to the power amplifier 270. The power supply to the power amplifier is substantially proportional to the digital AM data part. The power amplifier 270 is operating in non-linear mode or switched mode, e.g., Class B, C, D, E or F. The analog signal from the DAC 190 and the output from of the power supply 250 may be filtered by low pass filters (LPF) 192, 252. The polar transmitter 202 further comprises a PA bias control 260 for setting PA bias voltages and currents if so desired. It is also desirable to have a bandpass filter (BPF) 160 to filter the signal from the variable gain amplifier 150.

Figure 11A:
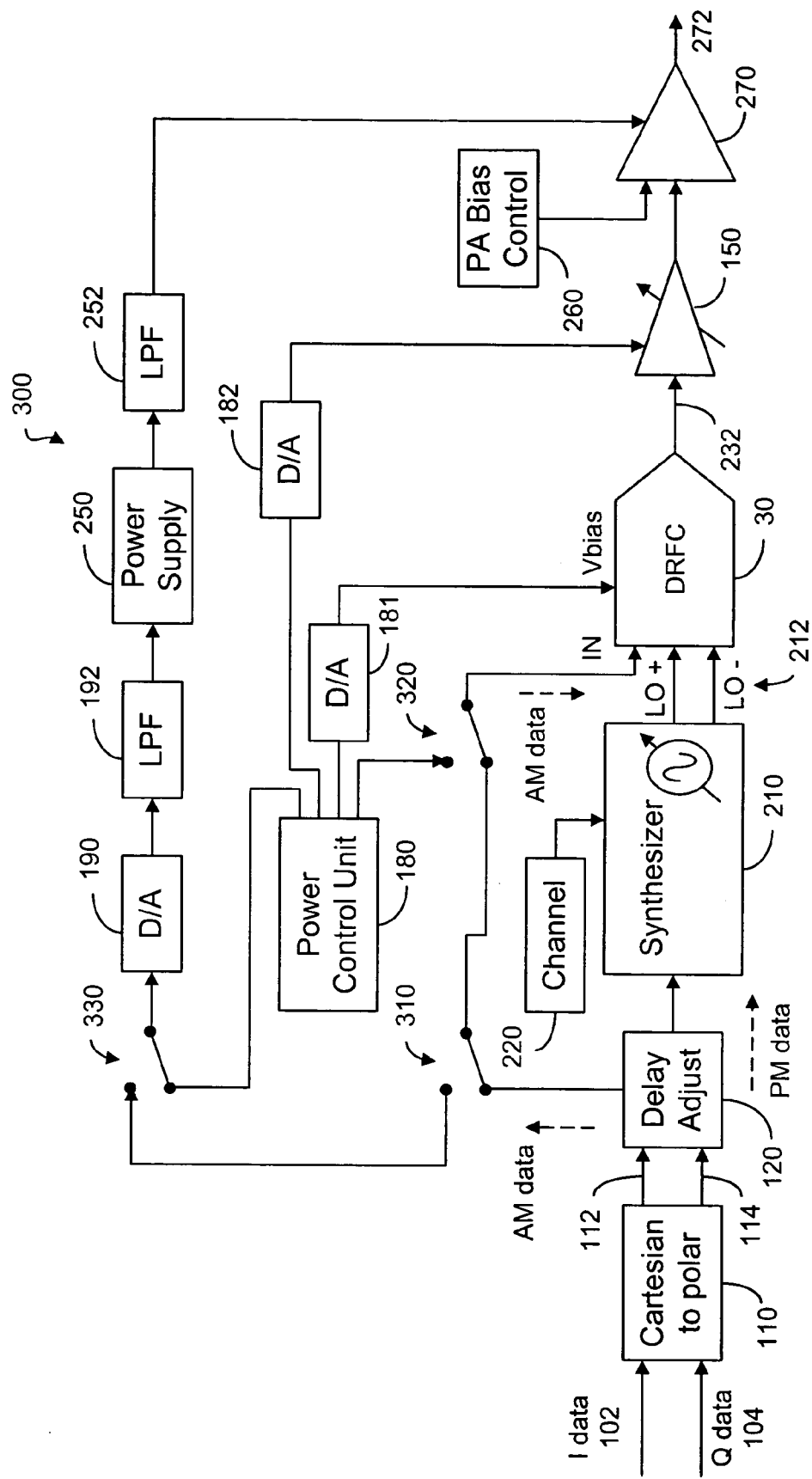
FIG. 11a is a block diagram showing a reconfigurable polar transmitter operated in the linear mode, using the converter architecture of the present invention.
Figure 11B:
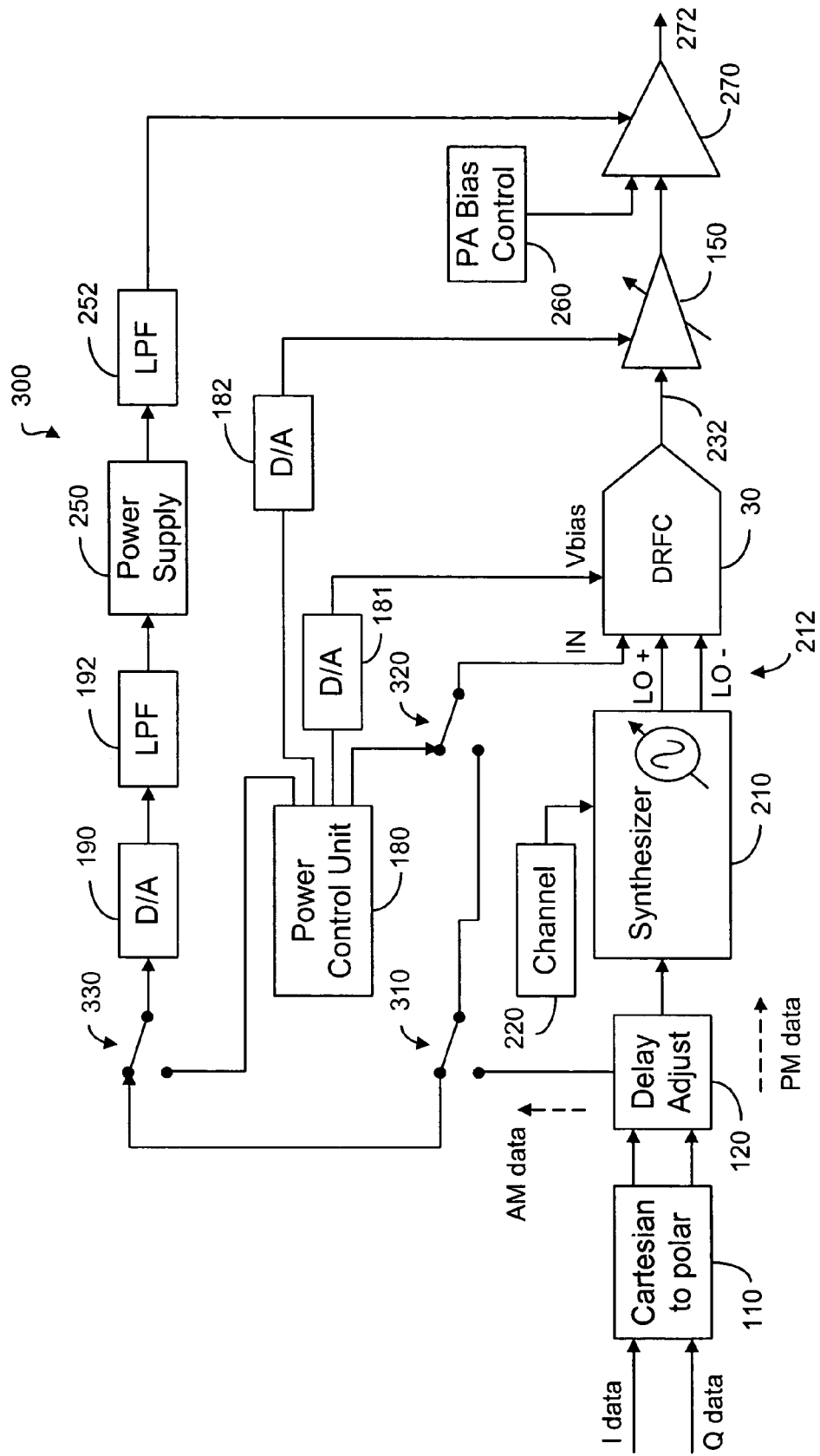
FIG. 11b is a block diagram showing the reconfiguration polar transmitter operated in the switched mode.

In a different embodiment of the present invention, the polar transmitter with digital amplitude modulation is re-configurable to operate in a linear mode or in a switched mode, as shown in FIGS. 11a and 11b. In the re-configurable polar transmitter 300, amplitude modulation can be carried out at the DRFC 30 (linear mode) or at the power amplifier 270 (switched mode) through the control of switches 310, 320 and 330. The power amplifier 270 can operate in switched mode or in linear mode.

When the polar transmitter 300 is operated in the linear mode, as shown in FIG. 11a, the output signal 232 at the DRFC 30 is phase and amplitude modulated RF, and the voltage supply to the power amplifier 270 is a constant value.

The output signal 272 is substantially an amplified version of the phase and amplitude modulated RF signal 232. The power amplifier 370 is operating as Class A or AB.

When the polar transmitter 300 is re-configured to operate in the switched mode, as shown in FIG. 11b, the output signal 232 is a phase-only modulated RF signal. The AM data part, after being converted to an analog signal by the DAC 190, is fed forward in order to be imposed on the phase-only modulated RF signal through modulating the power supply (provided by a power supply 250) of the power amplifier 270. The analog signal from the DAC 190 and the output from the power supply 250 may be filtered through low-pass reconstruction filters 192, 252. The polar transmitter 300 further comprises a PA bias control 260 for setting PA bias voltages and currents based on whether the power amplifier is operated in switched mode or linear mode. The DRFC 30 and the variable again amplifier 150 line up can be set to maximum gain for driving the non-linear power amplifier 270, when the polar transmitter 300 is operated in the switched mode.

The advantages of the polar transmitter using direct digital-to-RF conversion, according to the present invention over the IQ modulator approach include:
Increased power amplifier efficiency, increased battery life;
Reduced current consumption;
Reduced die area (cost);
More digital and therefore greater scalability, easier to port between processes;
Wider bandwidth and scalability to emerging wideband systems; and
Potential usage of the same hardware for multiple systems.
The advantages over the synthesizer modulation include:
No need for phase feedback;
No need for loop filter characterization- more robust for mass production;
No need for two point modulation and associated high-pass/low-pass delay and gain tuning.

It should be appreciated by persons skilled in the art that the band-pass filter 160 as shown in FIG. 10 may or may not be necessary depending on the requirements of the specific wireless system. Furthermore, the band-pass filter 160 may not be necessarily disposed between the variable gain amplifier 150 and the power amplifier 270. Moreover, a similar band-pass filter may be necessary for RF frequency filtering in the polar transmitters as shown in FIGS. 9, 11a and 11b.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A polar transmitter for transmitting radio frequency (RF) signals, said transmitter comprising:
    a carrier frequency generator comprising a generator input for receiving a signal indicative of a phase data part, wherein the radio frequency signals are based on a first digital baseband signal and a second digital baseband signal, the second baseband signal having a phase shift from the first baseband signal, and the radio frequency signals comprise a carrier frequency, and wherein the first baseband signal and the second baseband signal are converted into baseband signals in a polar form having an amplitude data part and the phase data part, the carrier frequency generator further comprising a generator output for providing the carrier frequency modulated by the phase data part; and
    a digital-to-RF conversion section for converting the carrier frequency modulated by the phase data part into phase-modulated signals so that the amplitude data part is caused to impose on the phase-modulated signals for providing the RF signals, the digital-to-RF conversion section comprising:
    a carrier input having two input ends to receive a carrier signal indicative of the carrier frequency modulated by the phase data part,
    a data input to receive a data signal indicative of the amplitude data part, the data signal having a plurality of data bits, and
    a conversion component adapted to convert the data signal for providing a differential output signal modulated by the carrier signal, the differential output signal indicative of the phase-modulated signals, formed with current loads and provided between two output ends, the conversion component comprising:
    a plurality of conversion units connected in parallel, each unit adapted to receive a voltage indicative of a data signal value indicative of the data bits, the voltage provided between two voltage input ends, each unit comprising:
    a first differential switch section having:
        two input current paths, each operatively connected to a different one of the output ends; and
        two differential switch pairs connected to the voltage input ends for conveying in the two input current paths differential currents indicative of the data signal value;
    a second differential switch section having two current paths, each operatively connected in series to a different one of the two differential switch pairs, the current paths operatively and separately connected to different ones of the carrier signal ends, for modulating the differential currents with the carrier signal; and
    a current source, operatively connected in series to the second differential switch section for controlling currents in the current paths.

2. The polar transmitter of claim 1, further comprising:
    a power amplifier for adjusting the RF signals prior to transmission, the power amplifier having a voltage supply input; and
    a power supply having an input end and an output end, the output end operatively connected to voltage supply input for providing a supply voltage to the power amplifier.

3. The polar transmitter of claim 2, wherein the amplitude data part is operatively connected to the input end of the power supply so that said imposing of the amplitude data part on the phase-modulated signals is carried out through modulating the supply voltage to the power amplifier.

4. The polar transmitter of claim 2, wherein the RF conversion section further comprises a variable gain amplifier to adjust signal level of the RF signals.

5. The polar transmitter of claim 4, further comprising a bandpass filter disposed between the variable gain amplifier and the power amplifier for frequency filtering the RF signals.

6. The polar transmitter of claim 1, further comprising a channel selector for selecting the carrier frequency.

7. The polar transmitter of claim 1, wherein the first and second baseband signals are converted into the baseband signals by a conversion means, the amplitude data part is associated with a first path between the conversion means and the conversion component, and a second path associated with a second path between the conversion means and the conversion component through the carrier frequency generator, said polar transmitter further comprising a path adjuster for making the first and second paths substantially equal.

8. The polar transmitter of claim 3, wherein the first and second baseband signals are converted into the baseband signals by a conversion means, the amplitude data part is associated with a first path between the conversion means and the power amplifier through the power supply, and a second path associated with a second path between the conversion means and the power amplifier through the carrier frequency generator and the conversion section, said polar transmitter further comprising a path adjuster for making the first and second paths substantially equal.

9. The polar transmitter of claim 1, further comprising:
a power amplifier for adjusting the RF signals prior to transmission, the power amplifier having a voltage supply input;
a power supply having an input end and an output end, the output end operatively connected to voltage supply input for providing a supply voltage to the power amplifier,
a digital-to-analog converter operatively connected to the power supply, and
a switching means operatively connected between the power supply and the conversion section, said polar transmitter operable in a first mode and a second mode, such that
when the transmitter is operated in the first mode, the switching means is adapted to convey the amplitude data part to the conversion section so that the input signal converted by the conversion component is indicative of the amplitude data part, and
when the transmitter is operated in the second mode, the switching means is adapted to convey the amplitude data part to the input end of the power supply through the digital-to-analog converter so that said imposing of the amplitude data part on the phase-modulated signals is carried out through modulating the supply voltage to the power amplifier.

10. The polar transmitter of claim 9, further comprising a frequency filter for filtering data signals indicative of the amplitude data part conveyed through the digital-to-analog converter before the data signal is conveyed to the power supply when the transmitter is operated in the second mode.

11. The polar transmitter of claim 9, further comprising a frequency filter for filtering the supply voltage to the power amplifier.

12. The polar transmitter of claim 9, further having a power control module operatively connected to the input end of the power supply for adjusting the supply voltage to the power amplifier when the transmitter is operated in the first mode, and operatively connected to the conversion module for adjusting signal level of the differential output signals when the transmitter is operated in the second mode.

13. The polar transmitter of claim 1, wherein the carrier frequency generator comprises a phase-lock loop synthesizer.

* * * * *